United States Patent
Huber (10) Patent No.: US 7,580,473 B2
(45) Date of Patent: Aug. 25, 2009

(54) METHOD FOR MODULATING A CARRIER SIGNAL AND METHOD FOR DEMODULATING A MODULATED CARRIER SIGNAL

(75) Inventor: Klaus Huber, Darmstadt (DE)

(73) Assignee: Deutsche Telekom AG, Bonn (DE)

( * ) Notice: Subject to any disclaimer, the term of this patent is extended or adjusted under 35 U.S.C. 154(b) by 583 days.

(21) Appl. No.: 10/555,527

(22) PCT Filed: Feb. 9, 2004

(86) PCT No.: PCT/DE2004/000222

§ 371 (c)(1),
(2), (4) Date: Feb. 6, 2006

(87) PCT Pub. No.: WO2004/098041

PCT Pub. Date: Nov. 11, 2004

(65) Prior Publication Data

US 2006/0126756 A1    Jun. 15, 2006

(30) Foreign Application Priority Data

May 2, 2003    (DE) .................. 103 19 636

(51) Int. Cl.
   *H04L 27/00* (2006.01)
(52) U.S. Cl. .................................... 375/295
(58) Field of Classification Search ........ 375/295, 375/302, 308, 316
See application file for complete search history.

(56) References Cited

U.S. PATENT DOCUMENTS

| 4,613,974 A | 9/1986 | Vokac et al. |
| 5,657,145 A | 8/1997 | Smith |

FOREIGN PATENT DOCUMENTS

| DE | 3716054 | 11/1988 |
| DE | 4417611 | 3/1995 |
| DE | 19860097 | 7/1999 |
| DE | 10117563 | 11/2002 |

OTHER PUBLICATIONS

Sklar, Bernard, Digital Communications Fundamentals and Applications, 2000, Prentice Hall PTR, 2nd Edition, pp. 173-174.*
Soltis, J. J.; "A new universal class of discrete non-linear basis functions;" IEEE Conference Proceedings Article, Mar. 15, 2000, pp. 383-387.
Abramowitz, M. and Stegun, I.; "Handbook of Mathematical Functions with Formulas, Graphs, and Mathematical Tables," National Bureau of Statistics, Dec. 1972, Washington, D.C., Chapter 16, pp. 567-581.

* cited by examiner

*Primary Examiner*—Chieh M Fan
*Assistant Examiner*—Jaison Joseph
(74) *Attorney, Agent, or Firm*—Kenyon & Kenyon LLP (57) ABSTRACT

A method for modulating a carrier signal used for transmitting analog or digital message signals is provided. The module k of elliptic functions is used as a modulation parameter instead of the amplitude or the frequency. The carrier signal modulated according to this modulation method is provided with a constant amplitude and a fixed frequency while the signal form is chronologically modified at the rhythm of the message that is to be transmitted.

10 Claims, 4 Drawing Sheets

METHOD FOR MODULATING A CARRIER SIGNAL AND METHOD FOR DEMODULATING A MODULATED CARRIER SIGNAL

FIELD OF THE INVENTION

The present invention relates to a method for modulating a carrier signal for the transmission of message signals. The present invention also relates to a method for demodulating such modulated carrier signals. The present invention also relates to an analog circuit configuration for modulating a carrier signal that may be represented by an elliptic function.

BACKGROUND TECHNOLOGY

In information technology, high-frequency, sine-shaped or cosine-shaped carrier signals are generally utilized so as to be able to transmit information such as language, music, images or data. To this end, the message to be transmitted is modulated onto a carrier signal. Available modulation methods are the angle and amplitude modulation. In amplitude modulation the information contained in the message signal m(t) is modulated onto the carrier signal essentially according to the equation $s(t)=(a_0+c \cdot m(t)) \cdot \sin(2\pi f_0 t)$, where $f_0$ denotes the carrier frequency, and $a_0$ and c are constants that are selected according to the practical requirements. A characteristic property of amplitude modulation is that the amplitude of the signal s(t) is modulated in the rhythm of message m(t) to be transmitted, frequency $f_0$ of the modulated carrier signal not being able to be varied over time.

In the available angle modulation, the frequency or the phase is varied over time in the rhythm of the message signal m(t) to be transmitted. The frequency-modulated signal transmitted via a transmission channel is $s(t)=a_0 \cdot \sin(2\hat{\pi}f(m(t)))$, where frequency f(m(t)) in most cases being defined by the expression $(f_0+c\ m(t))$. In a frequency modulation amplitude $a_0$ is constant.

SUMMARY OF THE INVENTION

Embodiments of the present invention may involve adding a new modulation and demodulation method to available modulation and demodulation methods.

Additional embodiments of the present invention may involve providing an analog modulator circuit for the new modulation method.

Additional embodiments of the present invention may involve applying a so-called signal shape modulation method in which—in contrast to the amplitude and angle modulation—neither amplitude $a_0$ nor frequency $f_0$ is varied over time in the rhythm of the message signal to be transmitted. Instead, the signal shape of the carrier signal itself is varied.

A method for modulating a carrier signal for the transmission of message signals is described herein. In embodiments of the present invention, the signal shape of the carrier signal may be varied over time by a message signal to be transmitted, the amplitude and the frequency of the carrier signal remaining constant.

For the purpose of delimiting it from the classic amplitude and frequency modulation, the new modulation method also will be referred to as the signal shape modulation method.

The signal shape modulation method may be based on the modulation of carrier signals whose time characteristic is defined by an elliptic function. Jacobian elliptic functions, which, for example, are described in the book by A. Hurwitz, "Vorlesungen über allgemeine Funktionentheorie und elliptische Funktionen" [i.e., "Lectures on general function theory and elliptic functions"], 5$^{th}$ edition, Springer Berlin Heidelberg New York, 2000, incorporated in its entirety by reference herein, may be utilized.

In embodiments of the present invention, neither amplitude nor frequency but modulus k, which determines the form of an elliptic function, may be used as modulation parameters. Modulus k may be varied over time by the message signal to be transmitted so as to modulate the signal shape of the carrier signal in the rhythm of the message signal to be transmitted.

The time characteristic of the modulated carrier signal may be defined by the elliptic function $s(t)=a_0 sx(2\hat{\pi}f_0 t,k(t))$, $a_0$ being the amplitude and $f_0$ the frequency. $\hat{\pi}$ and modulus k may be linked via the complete elliptic integral of the first kind.

In embodiments of the present invention, the function $sx(2\hat{\pi}f_0 t,k(t))$ for $0 \leq k(t) \leq 1$ may be defined by the Jacobian elliptic function $sn(2\hat{\pi}f_0 t,k(t))$, and for $-1 \leq k(t) \leq 0$ by the Jacobian elliptic function $cn(2\hat{\pi}f_0(t-T/4), |k(t)|)$.

In embodiments of the present invention, using elliptic functions, available orthogonal transmission methods based on sine and cosine carriers may be generalized, thus making it possible to use new orthogonal modulation methods. Orthogonal carrier signals which are defined by the two orthogonal elliptic functions $sn(2\hat{\pi}f_0 t,k(t))$ and $sd(2\hat{\pi}f_0 t,k(t))$, or by the two orthogonal elliptic functions $cd(2\hat{\pi}f_0 t,k(t))$ and $cn(2\hat{\pi}f_0 t,k(t))$, may be utilized toward this end.

In embodiments of the present invention, the carrier signals defined by an elliptic function may be generated using an analog circuit configuration. Analog circuit configurations may be made up of operational amplifiers, integrators, multipliers, differential amplifiers and dividers known per se. Analog circuit configurations for generating elliptic functions are described in the patent application, having title "Analog Circuit System for Generating Elliptic Functions," filed as International Application No. PCT/DE2004/000223, and being filed as a U.S. patent application on Nov. 2, 2005, which is hereby incorporated in its entirety by reference.

Embodiments of the present invention may involve a method for demodulating a modulated carrier signal is provided whose time characteristic is described by elliptic function $s(t)=a_0 \cdot sx(2\hat{\pi}f_0 \cdot t, k(t))$. $a_0$ is the amplitude and $f_0$ is the frequency of the carrier signal, $\hat{\pi}$ and modulus k being linked via the complete elliptic integral of the first kind.

In embodiments, for demodulation, the received modulated carrier signal may be sampled at instants that correspond to the odd multiples of T/8, with $T=1/f_0$. Modulus k(t)—and hence transmitted message signal m(t)—may be obtained from the sampling values.

In alternative embodiments, i.e., an alternative demodulation method, received modulated carrier signal $s(t)=a_0 \cdot sx(2\hat{\pi}f_0 \cdot t, k(t))$ may be integrated in order to obtain modulus k(t).

In alternative embodiments, i.e., another alternative demodulation method, received modulated carrier signal $s(t)=a_0 \cdot sx(2\hat{\pi}f_0 \cdot t, k(t))$ may be squared and then integrated.

In embodiments, the modulator may be distinguished by the fact that the modulation of the carrier signal is implemented in such a way that the signal shape of the carrier signal is able to be varied over time by a message signal to be transmitted, the amplitude and the frequency of the carrier signal remaining constant.

In embodiments, a special development of the modulator may have an analog circuit configuration which provides at least one modulated carrier signal whose curve profile corresponds to or approximates an elliptic function at least in sections.

In embodiments, the elliptic functions may be Jacobian elliptic functions.

In embodiments, since the modulator modulates neither the amplitude nor the frequency of the carrier signal, devices may be provided that vary modulus k of an elliptic function over time by the message signal to be transmitted in order to modulate the signal shape of the carrier signal in the rhythm of the message signal to be modulated.

In embodiments, the analog circuit configuration of the modulator may generate a modulated carrier signal whose time characteristic is defined by the elliptic function $s(t)=a_0 \cdot sx(2\hat{\pi}f_0 \cdot t, k(t))$, $a_0$ being the amplitude and $f_0$ the frequency of the carrier signal, $\hat{\pi}$ and modulus k being linked via the complete elliptic integral of the first kind.

In embodiments, the circuit configuration may have first analog multipliers as well as analog integrators which are interconnected in such a way that the circuit configuration provides the three output functions $sn(2\hat{\pi}f_0t,k(t))$;

$cn(2\hat{\pi}f_0t,k(t))$; and $dn(2\hat{\pi}f_0t,k(t))$.

In embodiments, an analog division device for forming quotient $sn(2\hat{\pi}f_0t,k(t))/dn(2\hat{\pi}f_0t,k(t))$, and a second analog multiplier, assigned to the division device, may be provided, which multiplies the output signal of the division device by factor $\sqrt{1-k^2}$. For $0 \leq k(t) \leq 1$, output signal $sn(2\hat{\pi}f_0t,k(t))$ forms the modulated carrier signal, whereas for $-1 \leq k(t) \leq 0$, the output signal of the second analog multiplier forms the modulated carrier signal.

DETAILED DESCRIPTION

In the following, a new modulation method for data transmission is described, which uses as modulation parameters not the amplitude or frequency of a carrier signal, but the signal shape. The new modulation method may be based on elliptic functions and is distinguished in that, in contrast to the amplitude modulation, the amplitude of the carrier signal remains unchanged and that, in contrast to the frequency modulation, the frequency of the carrier signal remains unchanged as well. As mentioned, the new modulation method may be based on the Jacobian elliptic functions $sn(2\hat{\pi}f_0t,k)$, $cn(2\hat{\pi}f_0t,k)$ and $dn(2\hat{\pi}f_0t,k)$. The second argument of Jacobian elliptic functions, value k, is called the modulus of the elliptic functions and—as described in more detail herein—is used as a new modulation parameter. In other words, for example, the modulus of Jacobian elliptic functions is modulated in accordance with a message m(t) to be transmitted. Modulus k thus becomes a function of time and is described by k(t). It is assumed here that the frequency of the message to be transmitted and thus the frequency of the change of k(t) is small with respect to frequency $f_0=1/T$ of the variation of the carrier signal. The modulated carrier signal transmitted via a message channel may be indicated by $$s(t)=a_0 \cdot sx(2\hat{\pi}f_0 \cdot t, k(t)) \quad (1)$$

The role of $\pi$ in the classic sine or cosine carrier signals is assumed by $\hat{\pi}$ in elliptic functions. $\hat{\pi}$ is a function of modulus k, the correlation between $\hat{\pi}$ and k being given by the so-called complete elliptic integral of the first kind as follows:

$$\frac{\hat{\pi}}{2} = K(k) = \int_0^{\pi/2} \frac{d\varphi}{\sqrt{1-k^2\sin^2(\phi)}} \quad (2)$$

$\hat{\pi}$ may easily be calculated with the aid of the equation $$\hat{\pi} = \frac{\pi}{M(1, \sqrt{1-k^2})}, \quad (3)$$

$M(1, \sqrt{1-k^2})$ being the arithmetic-geometric mean of 1 and $\sqrt{1-k^2}$.

Figure 5:
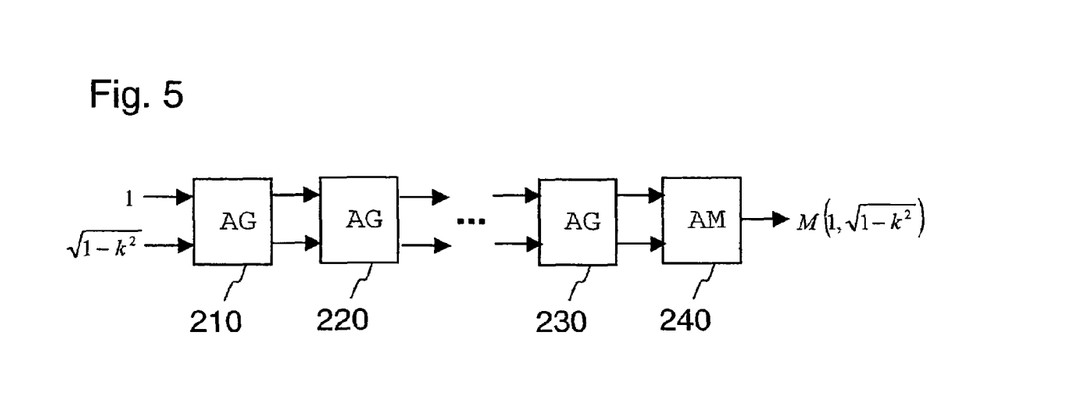
FIG. 5 shows a circuit configuration for calculating the arithmetic-geometric mean M.
Figure 6:
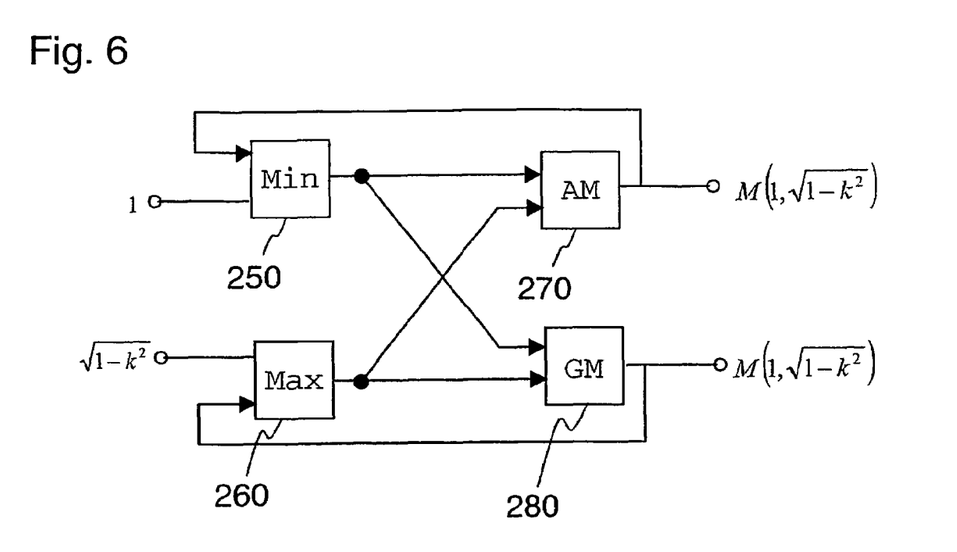
FIG. 6 shows an alternative circuit configuration for calculating the arithmetic-geometric mean M.

Analog circuit configurations for calculating the arithmetic-geometric mean are shown in FIGS. 5 and 6. To be able to generate $\hat{\pi}$ in terms of circuit engineering, first of all, the arithmetic-geometric mean $M(1, \sqrt{1-k^2})$ may be realized, for example, using an analog circuit configuration, which is shown in FIG. 5. The circuit configuration shown in FIG. 5 is made up of a plurality of analog computing circuits 210, 220, 230, denoted by AG, as well as an analog computing circuit 240 for calculating the arithmetic mean from two input signals. Analog computing circuits 210 through 230 are implemented in such a way that they generate the arithmetic mean of the two input signals at one output, and the geometric mean of the two input signals at the other output. As shown in FIG. 5, the value 1 is applied to the first input of analog computing circuit 210, and the value $\sqrt{1-k^2}$ is applied to its other input. On condition that the factor $\sqrt{1-k^2}$ lies between 0 and 1, the output signal of analog circuit device or analog computing circuit 240 corresponds approximately to the arithmetic-geometric mean M of the values 1 and $\sqrt{1-k^2}$ applied to the inputs of analog computing circuit 210.

FIG. 6 shows an alternative analog circuit configuration for calculating the arithmetic-geometric mean M of the two values 1 and $\sqrt{1-k^2}$. The circuit configuration shown in FIG. 6 has an analog computing circuit 250 for calculating the minimum from two input signals, an analog computing circuit 260 for calculating the maximum from two input signals, an analog computing circuit 270 for calculating the arithmetic mean from two input signals, and an analog computing circuit 280 for calculating a geometric mean from two input signals. The value 1 is applied to an input of analog computing circuit 250, whereas the value $\sqrt{1-k^2}$ is applied to an input of analog computing circuit 260. The output of analog computing circuit 250 for calculating the minimum from two input signals is connected to the input of analog computing circuit 270 and analog computing circuit 280. The output of analog computing circuit 260 for calculating the maximum from two input signals is connected to an input of analog computing circuit 270 and an input of analog computing circuit 280. The output of analog computing circuit 270 is connected to an input of analog computing circuit 250, whereas the output of analog computing circuit 280 is connected to an input of analog computing circuit 260. In the analog circuit configuration shown in FIG. 6, the outputs of analog computing circuits 270 and 280 in each case supply the arithmetic-geometric mean M of 1 and $\sqrt{1-k^2}$.

Figure 7:
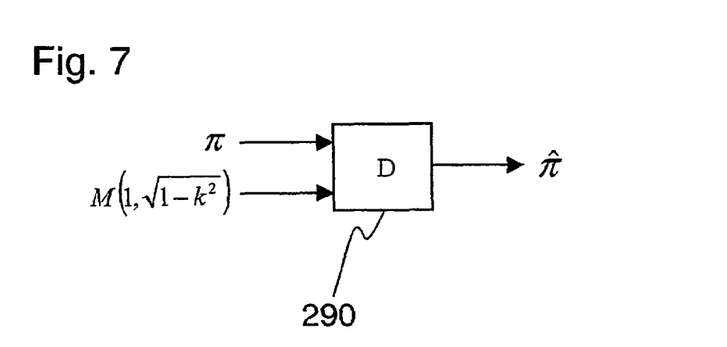
FIG. 7 shows a circuit configuration for calculating $\hat{\pi}$.

At this point, $\hat{\pi}$ may be calculated via a division device 290, shown in FIG. 7, at whose inputs are applied the number $\pi$ and the arithmetic-geometric mean $M(1, \sqrt{1-k^2})$ which is generated, for instance, by the circuit shown in FIG. 5 or in FIG. 6.

Figure 1:
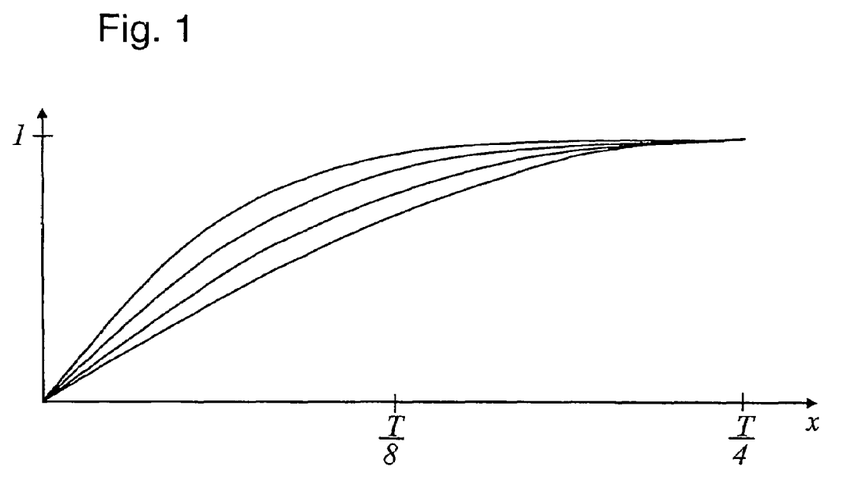
FIG. 1 shows a quarter period of the curve shapes of a carrier signal modulated with the aid of modulus k, $0 \leq k(t) \leq 1$.

A signal shape modulation of the carrier signal s(t) is implemented in accordance with the value of k, which varies over time; the zero crossings and the amplitude of the carrier signal remain unchanged, however. FIG. 1 shows various curve shapes of a carrier signal, modulated in its signal shape, over a quarter period of the function $sn(2\hat{\pi}f_0t,k)$ for k=0, k=0.8, k=0.95 and k=0.99. It should be noted that for k=0 the elliptic function reproduces the sine function, and for k=1 it reproduces the hyperbolic tangent. While the period of hyperbolic tangent is infinite, it leads to a pulse nevertheless by the scaling with $\hat{\pi}$. The utilization of the elliptic function $sn(2\hat{\pi}f_0t,k)$ yields signal shapes that lie above the sine function for $0 \leq t \leq T/4$. To generate signal shapes below the sine function as well, the Jacobian elliptic function $cn(2\hat{\pi}f_0t,k)$ may be utilized. In order to obtain this function in the same phase position as the Jacobian elliptic function $sn(2\hat{\pi}f_0t,k)$, function cn, shifted by T/4, is considered, which may be expressed as follows:

$$cn(2\hat{\pi}(t-T/4)f_0, k(t)) = \sqrt{1-k^2} \frac{sn(2\hat{\pi}f_0t, k(t))}{dn(2\hat{\pi}f_0t, k(t))} \quad (4)$$
$$= \sqrt{1-k^2} \, sd(2\hat{\pi}f_0t, k(t))$$

Figure 2:
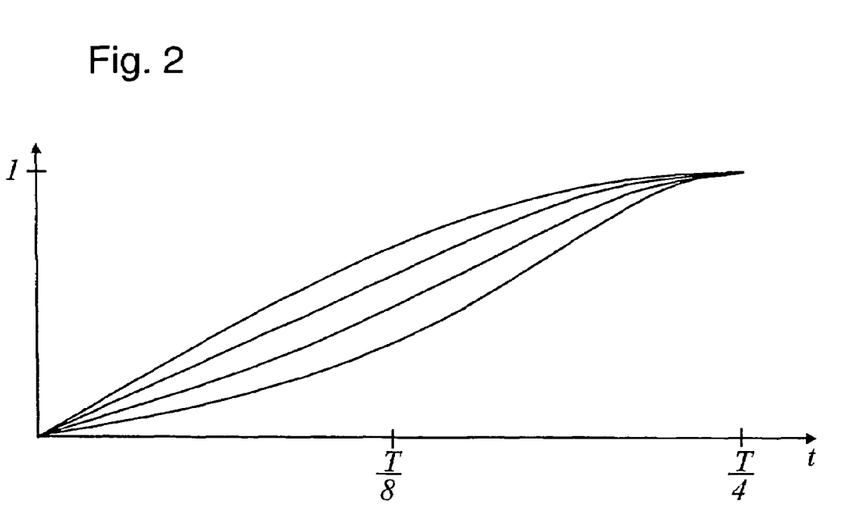
FIG. 2 shows a quarter period of the curve shapes of a carrier signal modulated with the aid of modulus k, $-1 \leq k(t) \leq 0$.

FIG. 2 illustrates the function $cn(2\hat{\pi}(t-T/4)f_0,k(t))$ for k=0, k=0.8, k=0.95 and k=0.99. For k=0, the sine function is obtained again.

It can be seen that a great variety of signal shapes may be covered by utilizing the Jacobian elliptic functions sn and cn. Accordingly, the function $sx(2\hat{\pi}f_0t,k(t))$, defined in equation 1, may be defined as follows:

$$sx(2\hat{\pi}f_0t, k(t)) = \begin{cases} sn(2\hat{\pi}f_0t, k(t)) & \text{for } 0 \leq k \leq 1 \\ \sqrt{1-k^2sd(s\hat{\pi}f_0t, |k|)} & \text{for } -1 \leq k \leq 0 \end{cases} \quad (5)$$

In this equation, k is the modulation parameter carrying the message. The values of k lie within the interval [-1.1].

Figure 3:
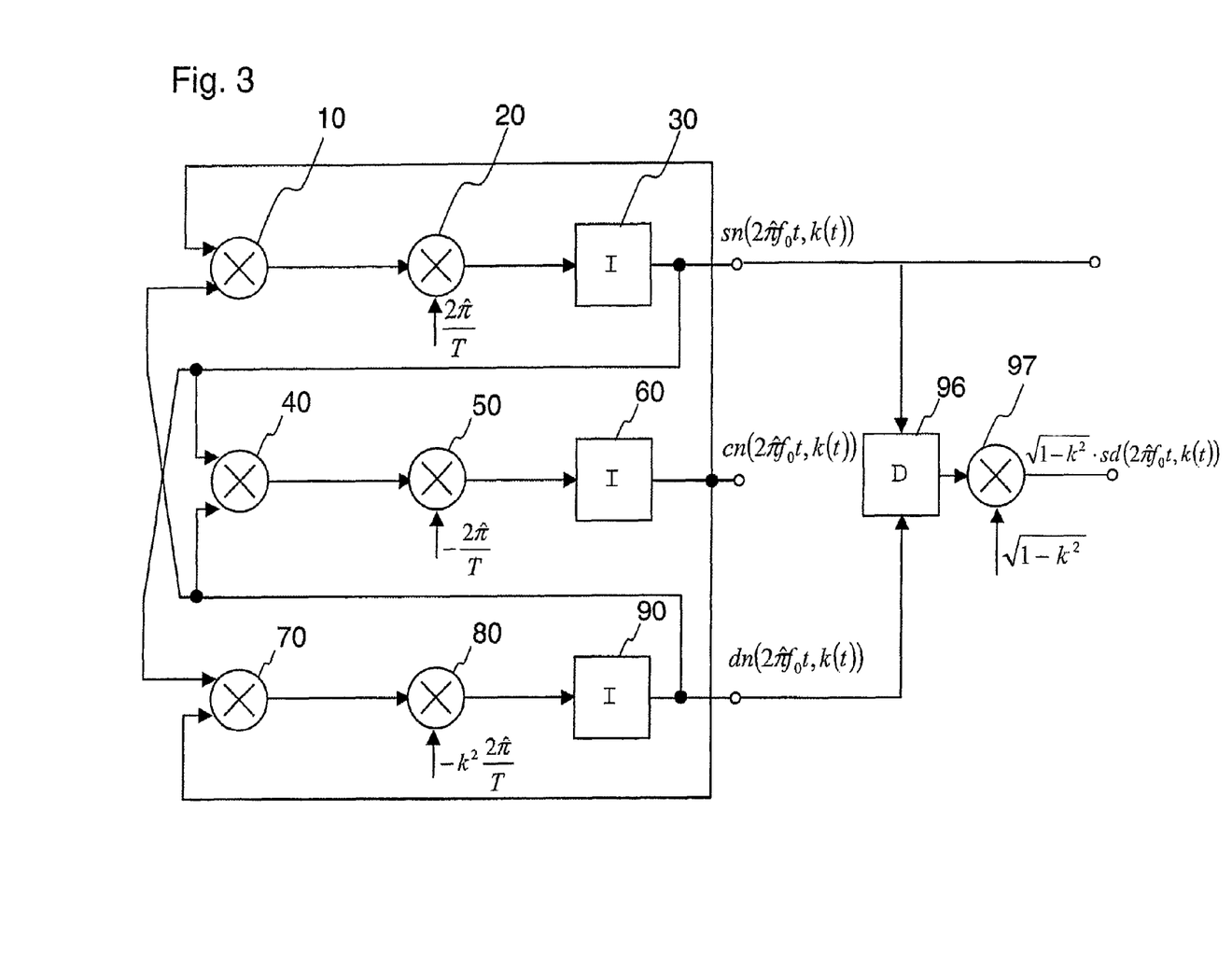
FIG. 3 shows an exemplary modulator according to the present invention.
Figure 4:
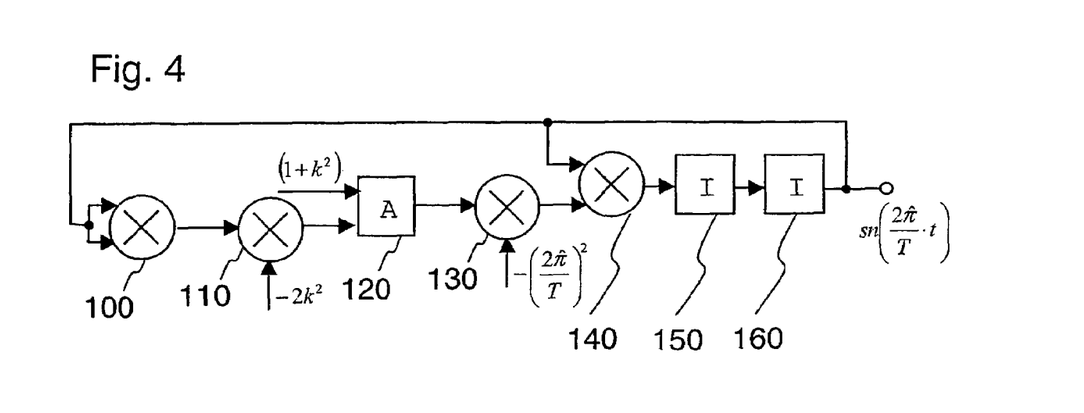
FIG. 4 shows an exemplary circuit configuration for generating the elliptic function $sn(2\hat{\pi}f_0t)$.

FIG. 3 shows an exemplary modulator, which is composed of analog computing circuits and electrically simulates the function $sx(2\hat{\pi}f_0t,k(t))$.

According to FIG. 3, a multiplier 10, a multiplier 20 and an analog integrator 30 are connected in series. Moreover, an analog multiplier 40, an analog multiplier 50 and a further analog integrator 60 are connected in series. A third series circuit includes an additional analog multiplier 70, an analog multiplier 80, as well as an analog integrator 90. Analog multiplier 20 multiplies the output signal of multiplier 10 by the factor $2\hat{\pi}/T$. Multiplier 50 multiplies the output signal of multiplier 40 by the factor $$-\frac{2\hat{\pi}}{T}.$$

Multiplier 80 multiplies the output signal of multiplier 70 by the factor $$-k^2\frac{2\hat{\pi}}{T}.$$

The output signal of integrator 30 is coupled back to multiplier 40 and to the input of multiplier 70. The output signal of integrator 60 is coupled back to the input of multiplier 10 and to the input of multiplier 70. The output of integrator 90 is coupled back to the input of multiplier 40 and to the input of multiplier 10.

It should be noted that measures, available in circuit engineering, for taking into account predefined initial states during initial operation are not marked in the circuit. Such an analog circuit configuration, shown in FIG. 3, delivers the Jacobian elliptic time function $sn(2\hat{\pi}f_0t)$ at the output of integrator 30, the Jacobian elliptic function $cn(2\hat{\pi}f_0t)$ at the output of integrator 60, and the Jacobian elliptic function $dn(2\hat{\pi}f_0t)$ at the output of integrator 90. It should be noted that the multiplication by $$\pm\frac{2\hat{\pi}}{T}$$

in multipliers 20 and 50, respectively, and the multiplication by $$-k^2\frac{2\hat{\pi}}{T}$$

in multiplier 80 may also be carried out in integrators 30, 60 and 90. The multiplication by $k^2$ may also be put at the output of integrator 90. Furthermore, it is possible to add to the circuit configuration shown in FIG. 3 available stabilizing circuits as they are described, for example, in the technical literature "Halbleiter Schaltungstechnik", [Semiconductor Circuit Technology"], Tietze, Schenk, Springer Verlag, 5th edition, 1980, Berlin Heidelberg New York, pages 435-438.

All three Jacobian elliptic time functions $sn(2\hat{\pi}f_0t)$, $cn(2\hat{\pi}f_0t)$ and $dn(2\hat{\pi}f_0t)$ may be realized simultaneously using the analog circuit configuration shown in FIG. 3. In addition, the derivatives of the Jacobian elliptic time functions sn, cn and dn may be obtained at the output of multipliers 10, 40 and 70, respectively.

Furthermore, a division device 96 is connected to the outputs of integrators 30 and 90 in order to generate the elliptic function $\sqrt{1-k^2}sd(2\hat{\pi}f_0t,k(t))$ in conjunction with a multiplier 97, which—as explained herein—corresponds to the elliptic function $cn(2\hat{\pi}f_0t,k(t))$ shifted by T/4.

As a result, the modulator may deliver at the output of integrator 30 a signal-shape-modulated carrier signal according to the Jacobian elliptic function sn($2\hat{\pi}f_0t,k(t)$), namely for $0 \leq k(t) \leq 1$. At the output of multiplier 97, the modulator is able to provide a signal-shape-modulated carrier signal according to the Jacobian elliptic function $\sqrt{1-k^2}\text{sd}(2\hat{\pi}f_0t,k(t))$, namely for $-1 \leq |k(t)| \leq 1$.

The signal-shape modulation is implemented via k or $\hat{\pi}$ in multipliers 20, 50 and 80. As mentioned, modulus k and $\hat{\pi}$ are linked via the complete elliptic integral of the first kind.

FIG. 7 illustrates an exemplary analog circuit for calculating $\hat{\pi}$ as a function of message signal m(t) to be transmitted, which modulates modulus k.

The signal-form modulation of carrier signal s(t) takes place in multiplier 80 via the expression $-k^2 2 \hat{\pi}/T$, in multiplier 50 via factor $-2\hat{\pi}/T$, and in multiplier 20 by factor $2\hat{\pi}/T$.

With the aid of the signal-shape modulation method, it is possible to modulate onto a carrier signal not only analog messages, but digital messages as well.

Figure 8:
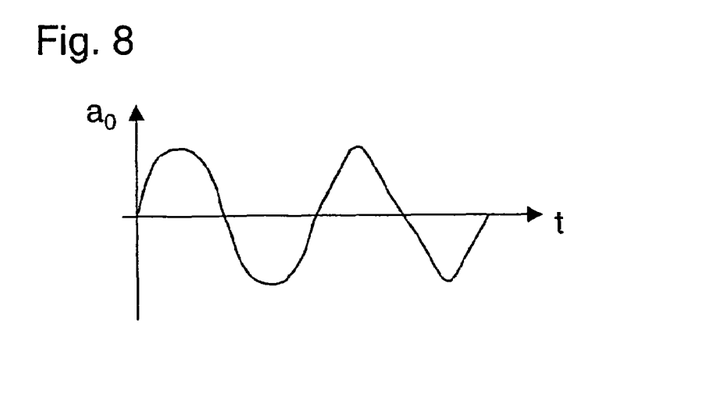
FIG. 8 shows section of the curve shape of a carrier signal modulated according to a binary shape jump method.

A simple binary, so-called form-jump method or "Formsprungverfahren" method may be defined, for instance, by the agreement to send a carrier signal s(t) according to the elliptic function $a_0\text{sn}(2\hat{\pi}f_0t)$ if a "1" is to be transmitted, and to transmit a carrier signal of the function $a_0\sqrt{1-k^2}\text{sd}(2\hat{\pi}f_0t)$ if a "0" is to be transmitted. In both cases modulation parameter k is set to 0.9, for instance. Under the simplified assumption that one bit is to be transmitted per period, the bit sequence "10" is transmitted by the two sequential signals. The corresponding curve shape is illustrated in FIG. 8.

Hereinafter, three exemplary demodulation methods are indicated to recover transmitted message signal m(t) from received modulated carrier signal s(t).

The first demodulation method is based on the fact that frequency $f_0=1/T$ of the carrier signal is fixed, and modulated carrier signal s(t) goes through zero twice every T seconds. At the instants zero and T/2, function s(t) has the zero value; at instants T/4 it has the value $a_0$; and at instant 3T/4 it has the value $-a_0$. At instants T/8 and 3T/8, function value $a_0\text{sx}(T/8)$ results. At instants 5T/8 and 7T/8, the function value is $$-a_0 sx\frac{T}{8}.$$

The value of $$sx\frac{T}{8}$$

is equal to $1/\sqrt{1+k'}$ for signal shapes above the sine function, and $\sqrt{k'}/\sqrt{1+k'}$ for signal shapes below the sine function. Expression k' is equal to $\sqrt{1-k^2}$. Modulation parameter k(t), which changes slowly with respect to frequency $f_0$ of the carrier signal, and thus message m(t), may therefore be recovered by sampling in the odd multiples of T/8.

In the second demodulation method, one obtains the message signal by integration of received modulated carrier signal s(t) over a quarter period T/4 or a half period T/2. Using the integrals $$\int sn(x,k)dx = \frac{-\ln(dn(x)+kcn(x))}{k},$$

$$\int cn(x,k)dx = \frac{\arcsin(k \cdot sn(x))}{k},$$

which are described, for example, in I. S. Gradshteyn, I. M. Ryzhik, "Table of Integrals, Series, and Products", corrected and enlarged edition, Academic Press, 1980, page 630, 5.133, we obtain $$\int_0^{T/2} s(t)dt = \begin{cases} \int_0^{T/2} a_0 sn(2\hat{\pi}t/T)dt &= \frac{a_0 T}{2\hat{\pi}(k)k}\ln\frac{1+k}{1-k} \\ \int_0^{T/2} a_0 cn(2\hat{\pi}(t-T/4))dt &= \frac{a_0 T}{\hat{\pi}(k)k}\arcsin k \end{cases}$$

An integration over a quarter period in each case results in one half of the values.

According to the third demodulation method, modulated carrier signal s(t) is first squared and then integrated according to the equation $$\int_0^T s(t)^2 = \begin{cases} \int_0^T (a_0 sn(2\hat{\pi}t/T))^2 dt &= a_0^2 T\frac{K(k)-E(k)}{k^2 K(k)} \\ \int_0^T (a_0 cn(2\hat{\pi}t/T))^2 dt &= a_0^2 T\frac{E(k)-k'^2 K(k)}{k^2 K(k)} \end{cases}$$

E(k) is the so-called complete elliptic integral of the second kind, and k' is $\sqrt{1-k^2}$). An integration over half (a quarter of) a period in each case results in half (a quarter of) the value.

Using elliptic functions, available orthogonal modulation methods based on sine and cosine carriers may be generalized as well. Instead of the sine function, the function sx(x) from equation (5) may be used, and instead of the cosine function, function sy(x) with $x=2\hat{\pi}f_0t$ may be used, which is defined as follows:

$$sy(x,k(t)) = \begin{cases} cd(x,k(t)) & \text{for } 0 \leq k \leq 1 \\ cn(x,|k|) & \text{for } -1 \leq k \leq 0 \end{cases}$$

The function cd(x) is the sn(x) function shifted by K, i.e., cd(x)=sn(x+k). It may be expressed by cd(x)=cn(x)/dn(x). Then, the orthogonality property $$\int_0^{4K} sx(x) \cdot sy(x)dt = 0$$

applies.

As a result, elliptic functions may be used for the orthogonal modulation. When values are given for $a_0$, $f_0$ and k, one has two basic functions per dimension (sn and k'sd in the x-direction, and cd and cn in the y-direction), compared to only one basic function in classic sine carriers. The orthogonality may be used in the basic and/or in the transmission band.

What is claimed is:

1. A method for modulating a carrier signal for the transmission of message signals, comprising:
   varying a signal shape of the carrier signal over time by a message signal to be transmitted, an amplitude and a frequency of the carrier signal remaining constant,
   wherein a time characteristic of the carrier signal is defined by an elliptic function and the carrier signal defined by the elliptic function is generated using an analog circuit configuration.

2. A method for demodulating a modulated carrier signal, comprising:
   providing the modulated carrier signal having a time characteristic defined by elliptic function $s(t)=a_0 sx(2\hat{\pi}f_0 t, k(t))$, $a_0$ being the amplitude and $f_0$ being the frequency, and $\pi$ and the modulus k being linked via a complete elliptic integral of a first kind;
   sampling the received modulated carrier signal at instants that correspond to odd multiples of T/8, with $T=1/f_0$; and
   obtaining the modulus k(t) and the transmitted message signal from the scanning values.

3. A method for demodulating a modulated carrier signal, comprising:
   providing a modulated carrier signal having a time characteristic defined by the elliptic function $s(t)=a_0 sx(2\hat{\pi}f_0 t, k(t))$, $a_0$ being the amplitude and $f_0$ the frequency, and $\pi$ and the modulus k being linked via a complete elliptic integral of a first kind; and
   integrating the received modulated carrier signal to obtain time-dependent modulus k(t) and the transmitted message signal.

4. The method as recited in claim 3, wherein the function $sx(2\hat{\pi}f_0 t, k(t))$ for $0 \leq k(t) \leq 1$ is defined by Jacobian elliptic function $sn(2\hat{\pi}f_0 t, k(t))$, and for $-1 \leq |k(t)| \leq 0$ by Jacobian elliptic function $cn(2\hat{\pi}f_0(t-T/4), k(t))$.

5. A method for demodulating a modulated carrier signal, comprising:
   providing a modulated carrier signal whose time characteristic is defined by elliptic function $s(t)=a_0 sx(2\hat{\pi}f_0 t, k(t))$, $a_0$ being amplitude and $f_0$ being frequency, and $\pi$ and the modulus k being linked via a complete elliptic integral of a first kind;
   squaring the received modulated carrier signal; and then
   integrating the squared received modulated carrier signal to obtain the modulus k(t) and thus the transmitted message signal.

6. An apparatus for modulating a carrier signal for the transmission of message signals, comprising:
   a modulator, wherein the modulation by the modulator of the carrier signal (s(t)) is implemented so that a signal shape of the carrier signal is able to be varied over time by a message signal (m(t)) to be transmitted, the amplitude ($a_0$) and the frequency ($f_0$) of the carrier signal (s(t)) remaining constant,
   the modulator having an analog circuit configuration which supplies at least one modulated carrier signal (s(t)) whose curve shape at least one of sectionally corresponds to and is approximated to an elliptic function.

7. The modulator as recited in claim 6, wherein the elliptic function is a Jacobian elliptic function.

8. The modulator as recited in claim 6, wherein the analog circuit configuration has devices for modifying over time the modulus k of an elliptic function by the message signal to be transmitted so as to modulate the signal shape of the carrier signal in the rhythm of the message signal to be transmitted.

9. The modulator as recited in claim 6, wherein the analog circuit configuration generates a modulated carrier signal whose time characteristic is defined by the elliptic function $s(t)=a_0 \cdot sx(2f_0 t, k(t))$, $a_0$ being the amplitude and $f_0$ being the frequency, and $\pi$ and the modulus k being linked via a complete elliptic integral of a first kind.

10. The modulator as recited in claim 9, comprising:
    at least one first analog multipliers;
    at least one first analog integrators, the at least one first analog multipliers and the at least one first analog integrators being interconnected in such a way that they supply three output signals $sn(2\hat{\pi}f_0(t-T/4), k(t))$, $cn(2\hat{\pi}f_0(t-T/4), k(t))$, $dn(2\hat{\pi}f_0(t-T/4), k(t))$;
    an analog division device for forming the quotient $sn(2\hat{\pi}f_0(t-T/4), k(t))/dn(2\hat{\pi}f_0(t-T/4), k(t))$;
    a second analog multiplier which is assigned to the analog division device and multiplies the output signal of the division device by the factor $\sqrt{1-k^2}$, the output signal $sn(2\hat{\pi}f_0 t, k(t))$ forming the modulated carrier signal for $0 \leq k(t) \leq 1$, and the output signal of the second analog multiplier forming the modulated carrier signal for $-1 \leq k(t) \leq 0$.

* * * * *

UNITED STATES PATENT AND TRADEMARK OFFICE
CERTIFICATE OF CORRECTION

PATENT NO. : 7,580,473 B2
APPLICATION NO. : 10/555527
DATED : August 25, 2009
INVENTOR(S) : Klaus Huber It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 841 days.

Signed and Sealed this

Fourteenth Day of September, 2010

David J. Kappos
*Director of the United States Patent and Trademark Office*